United States Patent [19]

Brown

[11] 4,361,600
[45] Nov. 30, 1982

[54] METHOD OF MAKING INTEGRATED CIRCUITS

[75] Inventor: Dale M. Brown, Schenectady, N.Y.

[73] Assignee: General Electric Company, Schenectady, N.Y.

[21] Appl. No.: 320,255

[22] Filed: Nov. 12, 1981

[51] Int. Cl.³ .................. H01L 21/316; H01L 21/76
[52] U.S. Cl. .................................... 427/93; 156/603; 156/613; 156/649; 156/643; 156/659.1; 204/192 E; 204/192 EC; 427/94; 427/96
[58] Field of Search .............. 156/649, 643, 659.1, 156/603, 613; 427/93, 94, 96; 204/192 E, 192 EC

[56] References Cited

U.S. PATENT DOCUMENTS

| | | | |
|---|---|---|---|
| 4,292,156 | 9/1981 | Matsumoto et al. | 156/649 |
| 4,333,964 | 6/1982 | Ghezzo | 427/93 |
| 4,333,965 | 6/1982 | Chow | 427/93 |

OTHER PUBLICATIONS

Tango et al., "SOS LSI Technology", Toshiba Review, No. 113, pp. 34–37, Jan.-Feb. 1978.

Primary Examiner—John D. Smith
Attorney, Agent, or Firm—Julius J. Zaskalicky; James C. Davis, Jr.; Marvin Snyder

[57] ABSTRACT

A method of forming in a substrate of monocrystalline silicon semiconductor material having a major surface, a plurality of islands of silicon each including an active region of the substrate adjacent the major surface and surrounded by a body of silicon dioxide separating the islands from the substrate is described.

19 Claims, 19 Drawing Figures

METHOD OF MAKING INTEGRATED CIRCUITS

The present invention relates in general to integrated circuits and in particular to integrated circuits utilizing silicon dioxide regions to electrically isolate adjacent devices thereof.

As the dimensions of elementary devices in VLSI (very large scale integrated) circuits become smaller, it is important to minimize the distance between adjacent devices while maintaining electrical isolation between them. Oxide isolation is used to reduce the separation between adjacent devices which otherwise would be required to avoid undesired electrical coupling of adjacent devices. Such undesired coupling occurs, for example, when P channel and N channel transistor devices in a CMOS (complementary-metal-oxide-semiconductor) integrated circuit are so closely spaced that they form parasitic bipolar transistor structures that can act electrically like a silicon controlled rectifier. "Latch up" or undesired conduction occurs through the adjacent devices in response to transients such as bursts of radiation.

An object of the present invention is to provide a relatively simple and inexpensive method of fabricating integrated circuit devices with oxide isolation.

In carrying out the present invention in an illustrative embodiment thereof there is provided a substrate of monocrystalline silicon semiconductor material having a major surface and including an active region of said substrate adjacent said major surface thereof. An oxidation-resistant and etch-resistant masking layer is provided overlying and in registry with said active region. The substrate is patterned using said masking layer to form a mesa the top of which is said active region. A film of an oxidation-resistant material is formed on the sides of said mesa. The substrate is heated in an oxidizing atmosphere to a temperature and for a time to cause silicon dioxide to be grown in a direction generally perpendicular to said major surface of said substrate and laterally underneath said mesa from all sides thereof to form a first region of silicon dioxide surrounding said mesa and a second region of silicon dioxide underneath said mesa. Thus, the mesa is converted into an island surrounded by said first region of silicon dioxide and separated from said substrate by said second region of silicon dioxide. The film of oxidation-resistant material is removed to expose the side walls of said island. The substrate is heated to a temperature and for a time to cause silicon dioxide to be grown on the side walls of said island and to join with said first and second regions of silicon dioxide to form said body of silicon dioxide. The masking layer is removed to expose said major surface of said island.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Figure 1:
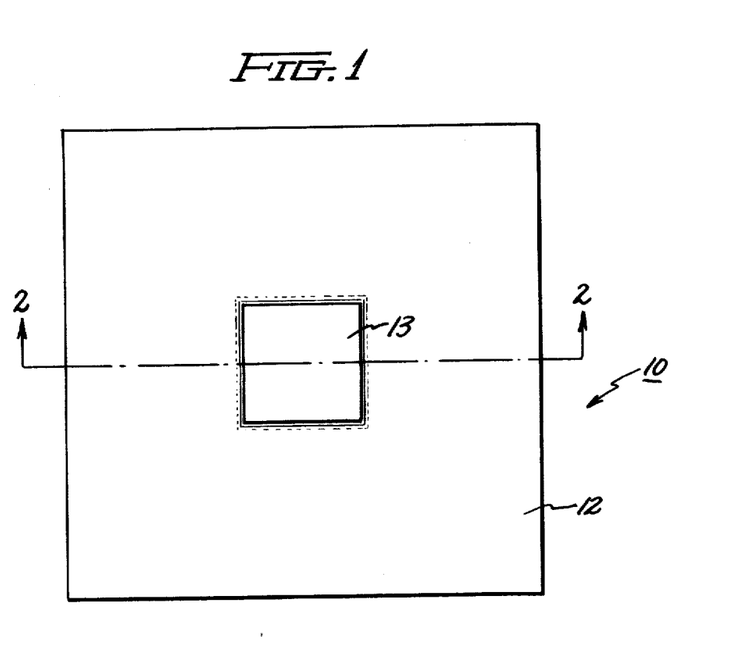
FIG. 1 is a plan view of a composite body representing a section of an integrated circuit showing a silicon substrate on which is formed an island member of silicon surrounded by a thick isolating layer or body of silicon dioxide.
Figure 2:
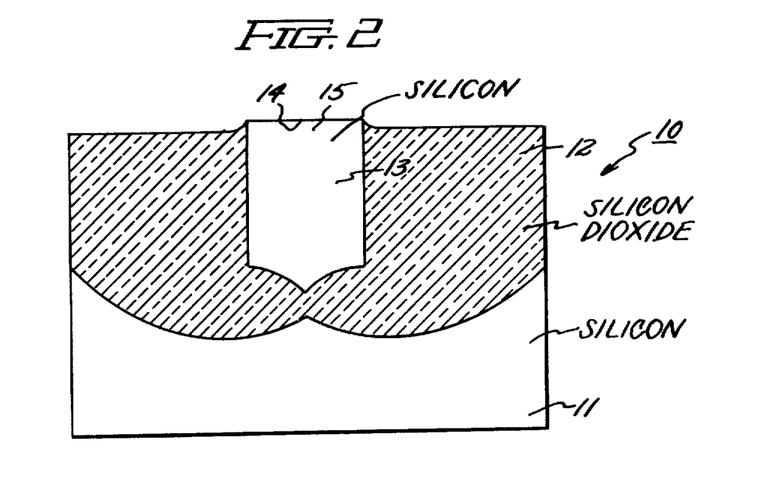
FIG. 2 is a cross sectional view of the section of the substrate of FIG. 1 taken along section lines 2—2 thereof.

Referring now to FIGS. 1 and 2, there is shown a composite body 10 representing a part of an integrated circuit made in accordance with the present invention. The composite body 10 includes a substrate 11 of silicon on which is formed a layer or body of silicon dioxide 12 in which, in turn is included an island member 13 of silicon originally a part of the silicon substrate 11 but now separated from the silicon substrate by growth of silicon dioxide underneath the island member. The silicon island 13 has a major surface 14 in which is provided the active region 15 of the island. Active components, such as field effect transistors (not shown) are formed in the active region 15 of the island member 13 adjacent the major surface thereof and are isolated from other active components formed on other islands, similarly formed, by the thick layer 12 of silicon dioxide.

Figure 3A:
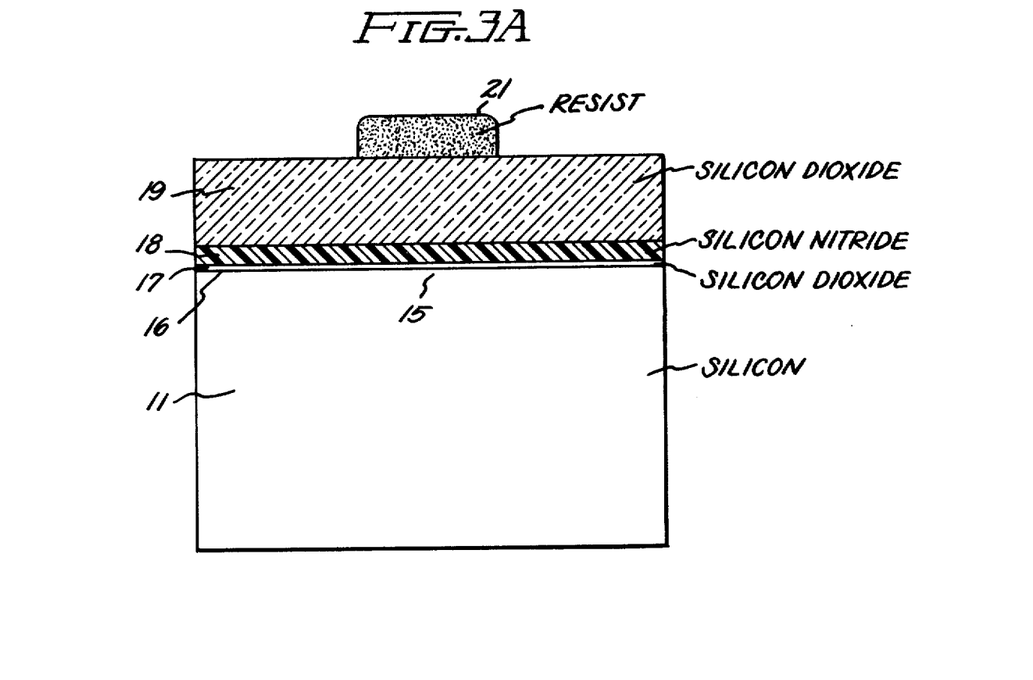
FIGS. 3A–3H are cross sections of structures representing successive steps in one method of fabricating the composite structure of FIGS. 1 and 2 in accordance with the present invention.
Figure 3B:
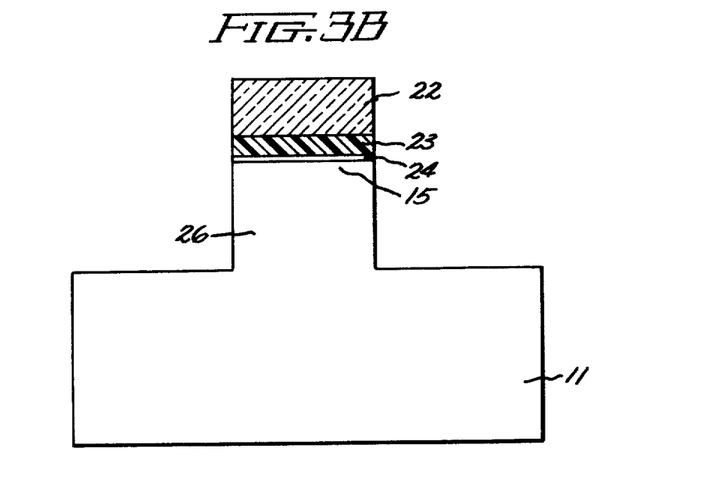
Figure 3C:
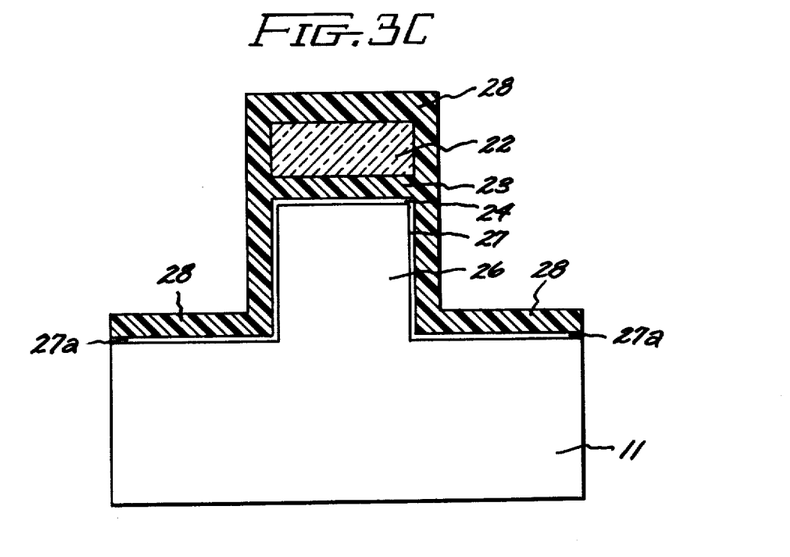
Figure 3D:
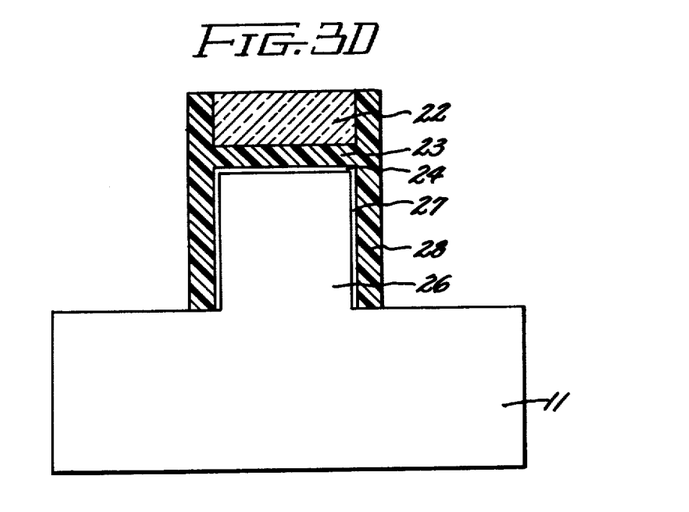

A method of fabricating the composite structure of FIGS. 1 and 2 in accordance with the present invention will now be described in connection with FIGS. 3A–3H. Elements of FIGS. 3A–3H identical to elements of FIGS. 1 and 2 are identically designated. A substrate 11 of monocrystalline silicon semiconductor material of 10 ohm-cm resistivity and an N-type conductivity having a major surface 16 parallel to a (100) crystallographic plane thereof is provided. A first thin layer 17 of silicon dioxide about 500 Angstroms thick is formed on the major surface 16 by techniques well known in the art, as shown in FIG. 3A. For example, the silicon substrate 11 is exposed in an ambient of oxygen at atmospheric pressure and at a temperature of about 1000° C. for a period of 60 minutes. A second layer 18 of silicon nitride is deposited on the surface of the first layer of silicon dioxide by chemical vapor deposition. For example, vapors of dichlorosilane and ammonia in the ratio of about 1:5 by volume are utilized at a temperature of about 800° C., at a pressure of 0.3 Torr, and for a time period of 50 minutes to form a layer of silicon nitride about 2000 Angstroms thick. A third layer 19 of silicon dioxide about 4000 Angstroms thick is deposited on the surface of the second layer of the silicon nitride by chemical vapor deposition. In this process vapors of silane are pyrolytically decomposed at a temperature 1000° C. in an oxygen carrier and for a time period of 30 minutes to form the layer 19 of silicon dioxide about 4000 Angstroms thick, as shown in FIG. 3A. A fourth layer of a suitable ion erosion resist such as an azide resist AZ1470 available from the Shipley Co. of Newton, Mass. is applied over the third layer of silicon dioxide. The fourth layer is exposed and developed to provide a retained portion 21 thereof about one micron wide and overlying and in registry with the active region 15 of the substrate 11. The exposed portion of the layer 19 of silicon dioxide unprotected by the retained portion 21 of the fourth layer is reactive ion etched, for example, using $C_3F_8$ to provide a retained portion 22 of silicon dioxide. Similarly, reactive ion etching with $C_3F_8$, a retained portion 23 of silicon nitride and a retained portion 24 of silicon dioxide both in registry with the active region 15 of the substrate are obtained. Thereafter, the exposed surface of the silicon substrate is reactive ion etched using carbon tetrachloride to a predetermined depth of about 2 microns to form a mesa 26. Assuming a reactive ion etch rate of silicon with carbon tetrachloride of about 1500 Angstroms per minute and an etch rate of silicon dioxide with carbon tetrachloride of about 100 Angstroms per minute, etching of a recess of about 2 microns deep would take about 14 minutes. During this time about 1400 Angstroms of the retained portion 22 of the layer of silicon dioxide would be eroded or etched away, as shown in FIG. 3B. What remains of the patterned layer of photoresist 21 is removed by a suitable resist stripper such as an oxygen plasma. Next, a protective layer 27 of silicon dioxide about 500 Angstroms thick is thermally formed on the sides of the mesa 26 and incidentally a thin layer 27a is formed on the other exposed portions of the silicon substrate, as shown in FIG. 3C. A fifth layer 28 of silicon nitride about 2000 Angstroms thick is then deposited on the side walls of the mesa 26 and the retained portions of the first, second and third layers lying over the mesa and also on the thin layer 27a of silicon dioxide on the exposed portions of the substrate 11. Thereafter, portions of the fifth layer 28 of silicon nitride contiguous to and overlying the thin layer 27a of silicon dioxide on the exposed portions of the substrate and also overlying the top the mesa structure are removed by reactive ion etching using $C_3F_8$ to provide the structure shown in FIG. 3D. The thin layer 27a of silicon dioxide is also removed in the latter steps as shown in FIG. 3D. It should be noted that the anisotropic etching character of the reactive ion etching process permits the removal of silicon nitride from those surfaces that are parallel to the electrodes of the reactive ion etching apparatus without appreciable etching of those surfaces perpendicular to these electrodes.

Figure 3E:
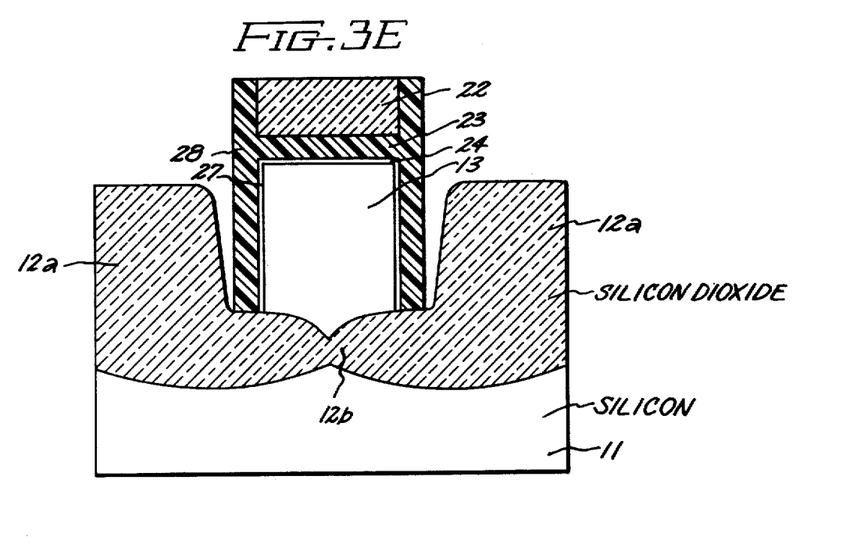
Figure 3F:
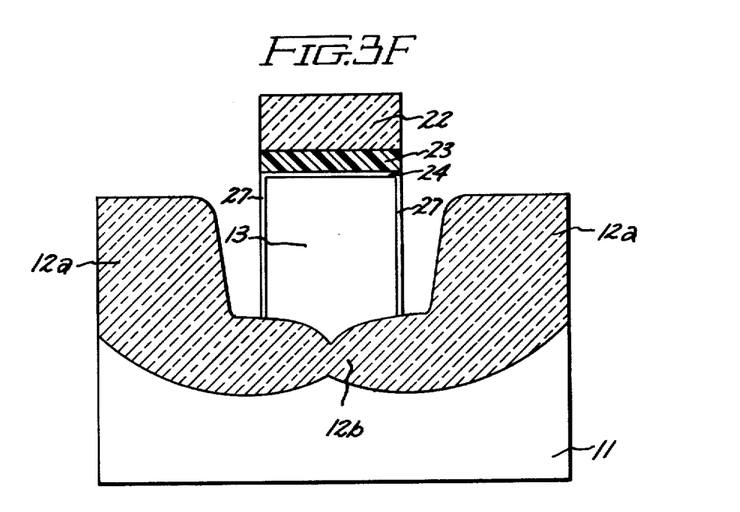
Figure 3G:
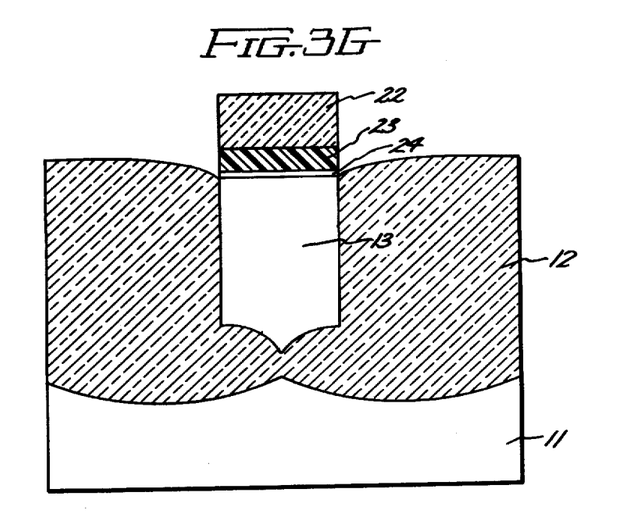
Figure 3H:
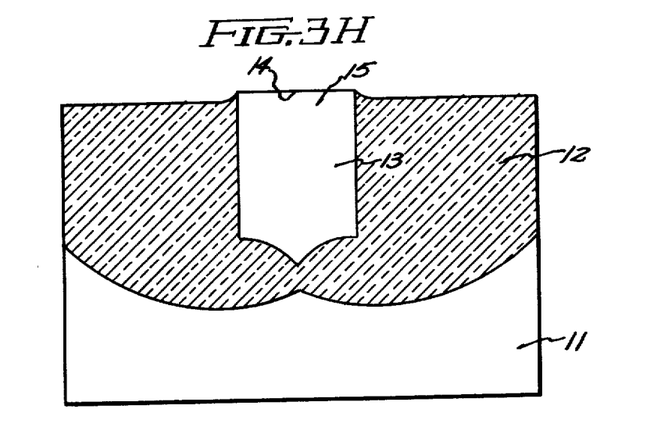

In the next step of the process, the substrate is heated in an oxidizing atmosphere to a temperature and for a time to cause silicon dioxide to grow in a direction generally perpendicular to the major surface of the substrate 11 and laterally underneath the mesa 26 from the sides thereof to form a first region 12a of silicon dioxide surrounding the mesa and a second region 12b of silicon dioxide underneath the mesa thereby converting the mesa 26 into an island 13 surrounded by the first region of silicon dioxide and separated from the substrate by the second region of silicon dioxide, as shown in FIG. 3E. Silicon is converted to silicon dioxide in an oxidizing atmosphere by reaction of the oxidant and silicon at the interface of silicon substrate and grown silicon dioxide layer. Initially, the rate of growth of silicon dioxide is reaction limited. However, as the layer of silicon dioxide becomes thicker, the rate of diffusion of the oxidant through the grown layer of silicon dioxide becomes a dominant factor and the rate of growth of silicon dioxide becomes slower. To assure a growth of silicon dioxide which is only reaction limited and hence occurs at a rapid rate, high pressure oxidation may be used. Use of high pressure oxidation assures oxidation of silicon underlying the mesa to form islands thereof. Thereafter, the retained portion of the layer 28 of silicon nitride formed on the sides of the island member 13 is removed utilizing a suitable etch such as hot phosphoric acid to provide the structure shown in FIG. 3F. The resultant structure is then heated in an oxidizing atmosphere to cause the side walls of the island member 13 to be converted to silicon dioxide and join with the first and second regions of silicon dioxide to form the body 12 of field oxide, as shown in FIG. 3G. The retained portion 22 of silicon dioxide is removed in buffered hydrofluoric acid. The retained portion 23 of silicon nitride is removed in hot phosphoric acid. The retained portion 24 of silicon dioxide is removed in buffered hydrofluoric acid. In the latter step a portion of the top surface of the body 12 of silicon dioxide is also removed. Thus, the top surface of the island member 13 is exposed providing the structure shown in FIG. 3H, and also shown in FIG. 2. Active components or devices, such as field effect transistors, may be formed in the active region and would be isolated from other active components formed in the substrate by the thick body 12 of silicon dioxide extending around and underneath the island member 13.

Figure 4:
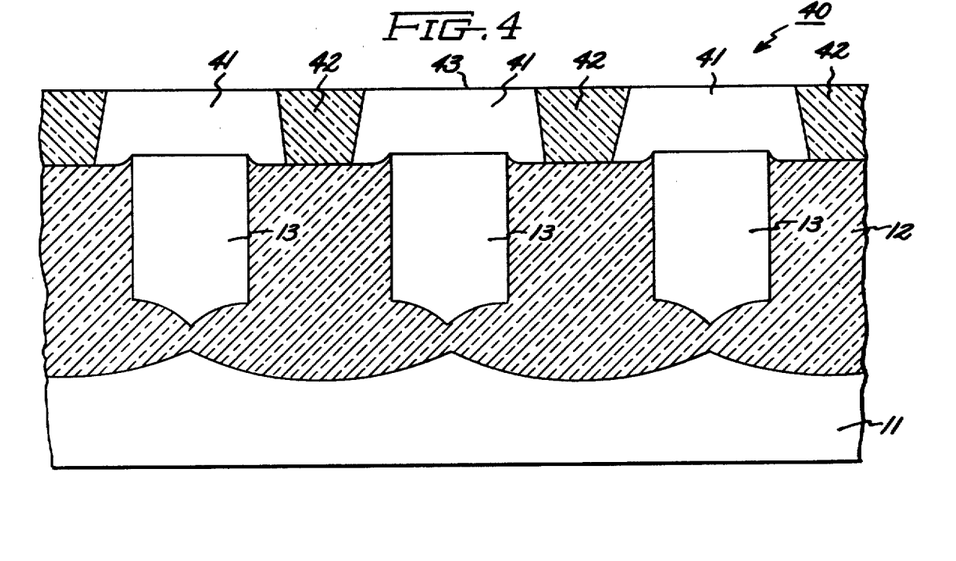
FIG. 4 is a cross-sectional view of a composite body representing a section of an integrated circuit showing a silicon substrate on which are formed several islands of silicon surrounded by a thick isolating layer of silicon dioxide in accordance with another aspect of the present invention.

An extension of the process shown in connection with FIGS. 3A–3H is illustrated in FIG. 4 which shows a sectional view of a composite body 40 in accordance with another aspect of the present invention. On the exposed surface of each of the islands 13 of silicon, only three of which are shown, a respective layer 41 of silicon is epitaxially grown, for example, by pyrolytic decomposition of silane. The epitaxial layers 41, which may have irregular top surfaces, and the spaces between the epitaxial layers are covered with a body 42 of a suitable glass. Solutions of such a glass are available, for example, from Emulsitone Co. of Whippany, N.J. The solution of glass is deposited on the composite body, spun and thereafter baked to provide a smooth surface of glass. Next the glass and the epitaxial layers contained therein are sputter etched to provide a planar surface 43 in which the exposed surfaces of the layers 41 lie in a common plane and isolated from each other by regions 42 of the glass and also by the body 12 of silicon dioxide in which the islands are contained. Active components, such as field effect transistors, may be formed in the layers 41. Interconnections between components may be made over the planar surface 43. The epitaxial layers 41 are isolated from the substrate 11 by the thick body 12 of silicon dioxide. CMOS circuits including both P channel and N channel MOSFET transistors which are dielectrically isolated may be readily formed in the layers 41 by techniques well known in the art.

Figure 5:
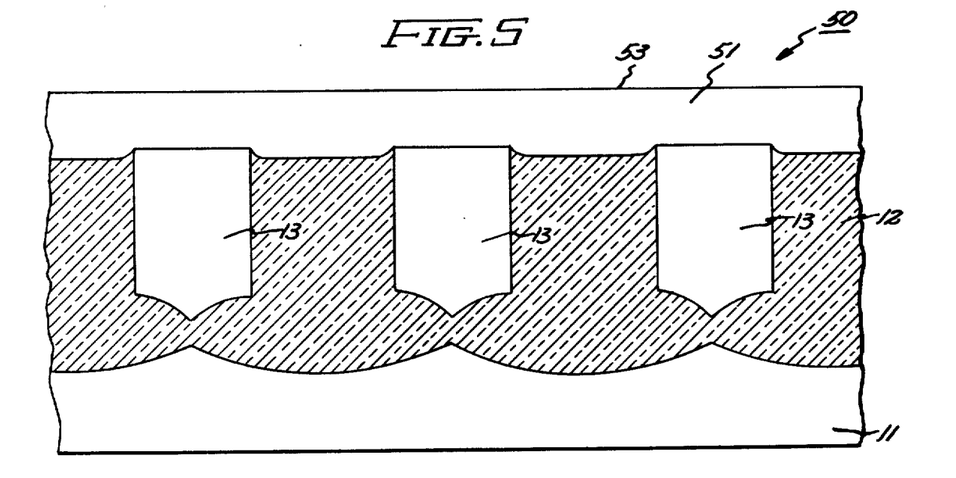
FIG. 5 is a cross-sectional view of a composite body representing a section of an integrated circuit showing a silicon substrate on which are formed several island members surrounded by a thick isolating layer of silicon dioxide in accordance with still another aspect of the present invention.

Referring now to FIG. 5, there is shown a sectional view of a composite body 50 in accordance with another aspect of the present invention. On the exposed surface of each of the islands 13 of silicon, only three of which are shown, a continuous layer 51 of silicon is epitaxially grown, for example, by pyrolytic decomposition of silane. The epitaxial layer 51 which may have an irregular top surface is covered with a body of glass (not shown). Thereafter the body of glass and the epitaxial layer covered thereby is sputter etched through to the epitaxial layer 51 to provide a planar surface 53 thereon. Active components, such as field effect transistors, may be formed in the layer 51. Interconnections may be made over the planar surface 53. Components formed on the layer 51 are isolated from the substrate 11 by the thick body 12 of silicon dioxide on the substrate 11. CMOS circuits including both P channel and N channel MOSFET transistors which are dielectrically isolated may be readily formed in the layer 51 by techniques well known in the art.

Figure 6:
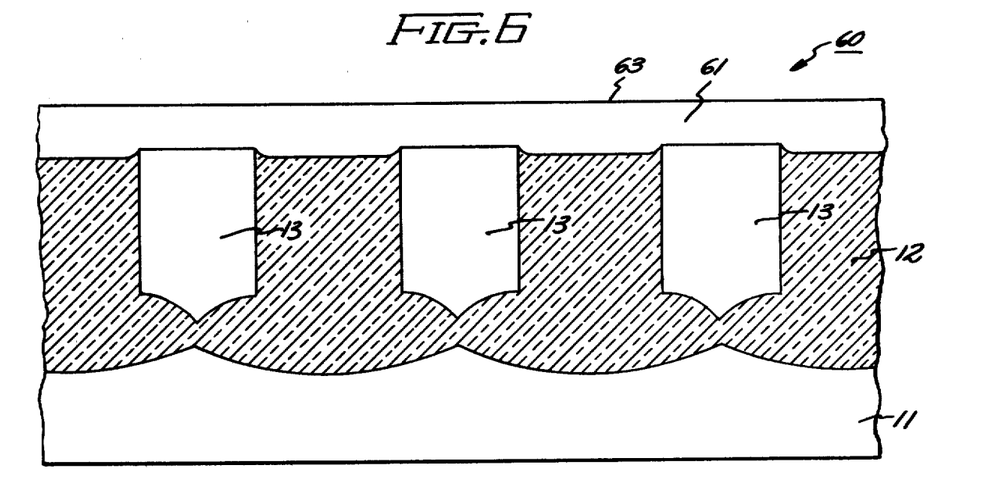
FIG. 6 is a cross-sectional view of a composite body representing a section of an integrated circuit showing a silicon substrate on which are formed several island members surrounded by a thick isolating layer of silicon dioxide in accordance with a further aspect of the present invention.

Referring now to FIG. 6, there is shown a sectional view of a composite body 60 in accordance with a further aspect of the present invention. On the exposed surface of each of the islands 13 of silicon, only three of which are shown, a continuous layer 61 of polycrystalline silicon is deposited, for example, by pyrolytic decomposition of silane at low temperature. The continuous layer 61 is annealed by any of a variety of means, such as thermal, laser or electron beam means to convert the layer into an epitaxial layer. The epitaxial layer 61 which may have an irregular top surface is covered with a body of glass (not shown). Thereafter the body of glass and the epitaxial layer covered thereby is sputter etched through to the epitaxial layer 61 to provide a planar surface 63 thereon. Active components, such as field effect transistors, may be formed in the layer 61. Interconnections may be made over the planar surface 63. Components formed on one layer 61 are isolated from the substrate 11 by the thick body 12 of silicon dioxide on the substrate 11. CMOS circuits including both P channel and N channel MOSFET transistors which are dielectrically isolated may be readily formed in the layer 61 by techniques well known in the art. Of course, if desired, in the process described above the polycrystalline layer of silicon could have been deposited on epitaxial layers grown on the islands of silicon 13.

While in the process described above in connection with FIGS. 3A-3H, a masking layer consisting of a retained portion 22 of silicon dioxide, a retained portion 23 of silicon nitride and a retained portion 24 of silicon dioxide was used, such masking layer can be constituted of other combinations of layers, for example, a thin layer of silicon dioxide of about 500 Angstroms overlying and in registry with the surface adjacent active region of the substrate and a relative thick layer of silicon nitride overlying the thin layer of silicon and also in registry with the active region of the substrate.

Figure 7A:
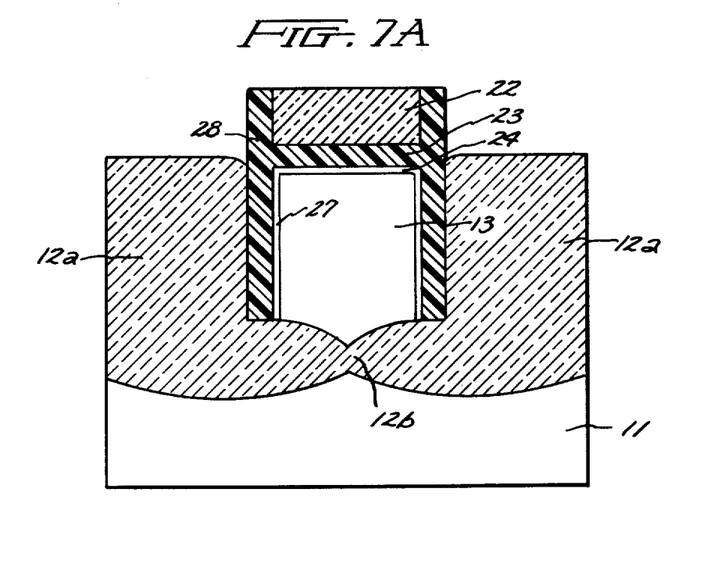
FIGS. 7A–7C are cross sections of structures representing steps in accordance with another embodiment of the present invention.
Figure 7B:
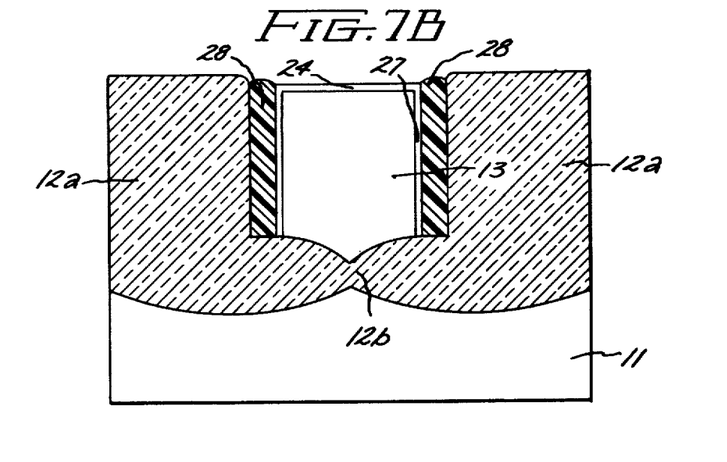
Figure 7C:
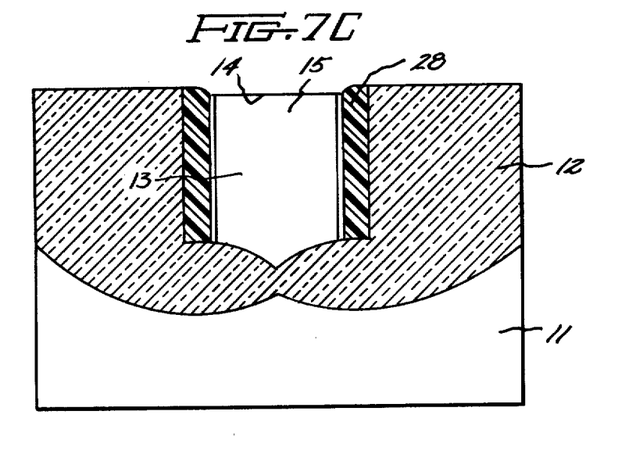

A modification may be made in the process described in connection with FIGS. 3A-3H eliminating a number of steps required to provide the islands 13 of silicon. Reference is made to FIGS. 7A-7C in which elements identical to the elements of FIGS. 3A-3H are identically designated. The steps of the modified process are identical to and including the process step represented by FIG. 3D. Thereafter, the substrate is heated in an oxidizing atmosphere to a temperature and for a time to cause silicon dioxide to grow in a direction generally perpendicular to the major surface of the substrate 11 and laterally underneath the mesa 26 from the sides thereof to form the first region 12a of silicon dioxide surrounding the mesa and the second region 12b of silicon dioxide underneath the mesa thereby converting the mesa 26 into an island 13 in the same manner as shown in connection with FIG. 3E. However, the oxidation proceeds for a time until the layer 12a of silicon dioxide extends beyond the level of the layer 24 of silicon dioxide and contiguous to the silicon nitride member 28, as shown in FIG. 7A. The retained portion 22 of silicon dioxide is removed in buffered hydrofluoric acid. The retained portion 23 of silicon nitride and the portions 28 of silicon nitride extending upward from portion 23 are removed in hot phosphoric acid, as shown in FIG. 7B. The retained portion 24 of silicon dioxide is then removed in buffered hydrofluoric acid. In the latter step a portion of the top surface of the body 12 of silicon dioxide is removed. Thus, the top surface of the island member 13 is exposed providing the structure shown in FIG. 7C. Active components or devices, such as field effect transistors, may be formed in the active region and would be isolated from other active components formed in the substrate by the thick body 12 of silicon dioxide extending around and underneath the island member 13.

Figure 8A:
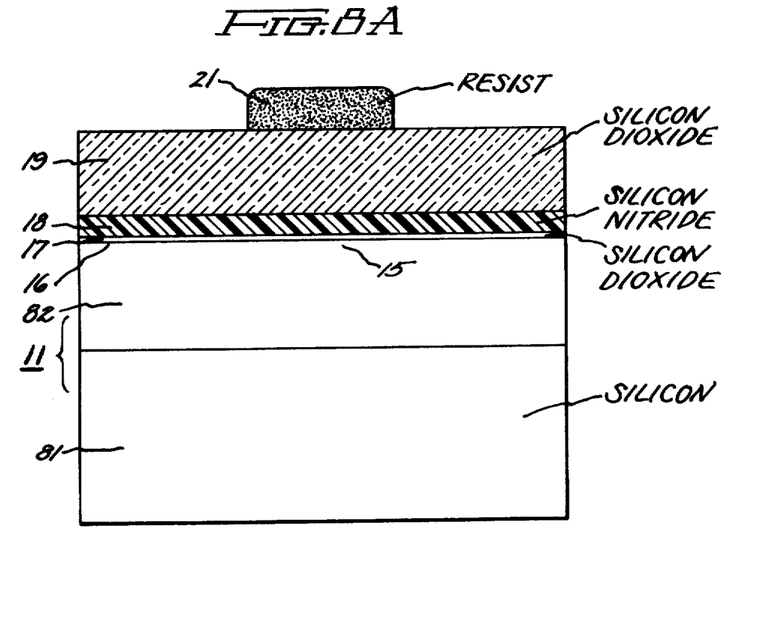
FIGS. 8A–8C are cross sections of structures representing steps in accordance with a further embodiment of the present invention.
Figure 8B:
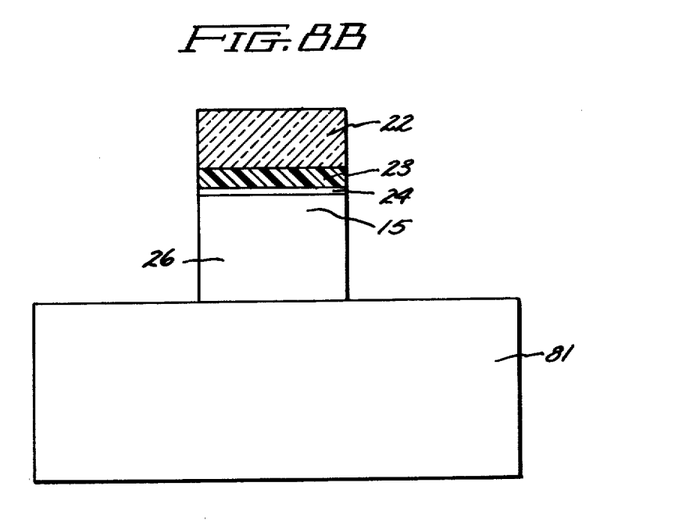
Figure 8C:
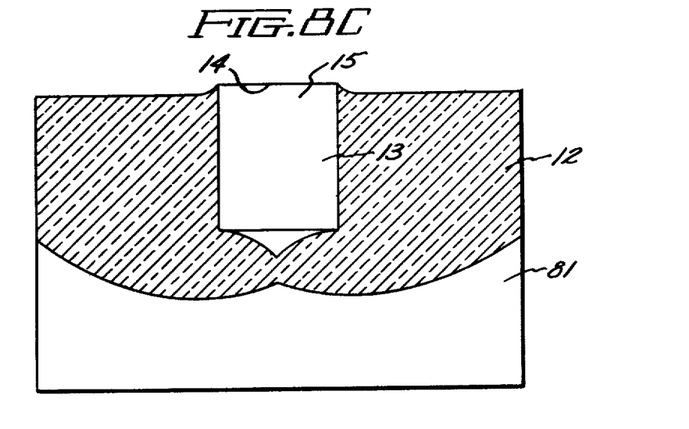

Another modification may be made in the process described in connection with FIGS. 3A-3H facilitating the formation of the islands of silicon. Reference is made to FIGS. 8A-8C in which elements identical to the elements of FIGS. 3A-3H are identically designated. This modified process starts with a substrate constituted of a first layer 81 of heavily doped silicon, for example, silicon doped N-type with a concentration of antimony atoms of about $10^{20}$ atoms per cm$^3$, over which a layer 82 of silicon is grown having a concentration of atoms of antimony of the order of $10^{15}$ atoms per cm$^3$, as shown in FIG. 8A. Such a structure could be formed by epitaxially growing the second layer on the first layer. Thereafter, the process is identical to the process of FIGS. 3A-3H except that reactive ion etching of the substrate of silicon is through the epitaxial layer 82 to the heavily doped layer 81. The heavily doped layer is more readily oxidized than the lightly doped epitaxial layer. Thus growth of silicon dioxide in the lateral direction from the sides of the mesa is enhanced thereby assuring formation of the islands 13 as shown in FIG. 8C. As in the process of FIGS. 3A-3H high pressure oxidation could be used in conjunction with the heavily doped substrate layer to enhance lateral oxidation to form the island 13.

While the invention has been described in connection with N-type substrates, of course, P-type substrates may as well be utilized.

For reasons of clarity and simplicity the dimensions of elements of devices shown in the drawings are not shown in the exact relative dimensions thereof.

While the invention has been described in specific embodiments, it will be understood that modifications such as those described above, may be made by those skilled in the art and it is intended by the appended claims to cover all such modifications and changes as fall within the true spirit and scope of the invention.

What is claimed is:

1. A method of forming, in a substrate of monocrystalline silicon semiconductor material having a major surface, an island of silicon including an active region of said substrate adjacent said major surface and surrounded by a body of silicon dioxide separating said island from said substrate comprising:

providing said substrate of monocrystalline silicon semiconductor material having said major surface and including said active region of said substrate adjacent said major surface thereof, providing an oxidation-resistant and etch-resistant masking layer overlying and in registry with said active region, patterning said substrate using said masking layer to form a mesa the top of which is said active region, forming a film of an oxidation-resistant material on the sides of said mesa, heating said substrate in an oxidizing atmosphere to a temperature and for a time to cause silicon dioxide to be grown in a direction generally perpendicular to said major surface of said substrate and laterally underneath said mesa from the sides thereof to form a first region of silicon dioxide surrounding said mesa and a second region of silicon dioxide underneath said mesa, whereby said mesa is converted into an island surrounded by said first region of silicon dioxide and separated from said substrate by said second region of silicon dioxide, removing said masking layer to expose said major surface of said island.

2. The method of claim 1 in which said substrate is heated in an oxidizing atmosphere under high pressure to enhance the oxidation of said substrate of silicon.

3. The method of claim 1 in which said substrate is constituted of a first layer of silicon having a very high concentration of a dopant and a second layer having a relatively low concentration of a dopant and overlying said first layer, and in which said mesa is formed in said second layer by etching said epitaxial layer to expose said first layer.

4. The method of claim 3 in which said substrate is heated in an oxidizing atmosphere under high pressure to enhance the oxidation of said substrate of silicon.

5. The method of claim 1 including removing said film of oxidation-resistant material to expose the side walls of said island prior to removing said masking layer, and thereafter heating said substrate to a temperature and for a time to cause silicon dioxide to be grown on the side walls of said island and to join with said first and second regions of silicon dioxide to form said body of silicon dioxide.

6. The method of claim 1 in which said oxidation-resistant and etch-resistant masking layer includes a first thin layer of silicon dioxide on said major surface, a second thick layer of silicon nitride on said first layer of silicon dioxide, and a third thick layer of silicon dioxide on said second layer of silicon nitride, each in registry with said active region.

7. The method of claim 1 in which said film of oxidation-resistant material on the sides of said mesa is constituted of silicon nitride.

8. The method of claim 7 in which said film on the sides of said island is formed by depositing a fourth layer of silicon nitride over exposed portions of said substrate, of said mesa and of said first, second, and third layers overlying said mesa, and thereafter removing the portions of said fourth layer of silicon nitride overlying the exposed portions of said substrate while retaining the portion of said fourth layer on the sides of said mesa.

9. The method of claim 8 in which prior to deposition of said fourth layer of silicon nitride, said substrate is heated in an oxidizing atmosphere and for a time to cause the exposed side walls of said mesa to be covered with a thin layer of silicon dioxide.

10. The method of claim 1 in which a layer of silicon is epitaxially grown on said exposed major surface of said island.

11. A method of forming in a substrate of monocrystalline silicon semiconductor material having a major surface, a plurality of islands of silicon each including an active region of said substrate adjacent said major surface and surrounded by a body of silicon dioxide separating said islands from said substrate comprising:

providing said substrate of monocrystalline silicon semiconductor material having said major surface and including a plurality of active regions of said substrate each adjacent said major surface thereof, providing an oxidation-resistant and etch-resistant masking layer including a plurality of retained portions each overlying and in registry with a respective one of said active regions, patterning said substrate using said masking layer to form a plurality of mesas, the top of each of which is a respective active region, forming a film of an oxidation resistant material on the sides of each of said mesas, heating said substrate in an oxidizing atmosphere to a temperature and for a time to cause silicon dioxide to be grown in a direction generally perpendicular to the major surface of said substrate and laterally underneath each of said mesas from the sides thereof to form a first region of silicon dioxide surrounding each of said mesas and a second region of silicon dioxide underneath each of said mesas, whereby each of said mesas is converted into a respective island surrounded by a respective first region of silicon dioxide and separated from said substrate by a respective second region of silicon dioxide, removing said masking layer to expose the major surface of each of said islands.

12. The method of claim 11 including removing said films of oxidation resistant material to expose the side walls of said island prior to removing said masking layer, and thereafter heating said substrate to a temperature and for a time to cause silicon dioxide to be grown on the sides of each of said islands and to join with said first and second regions of silicon dioxide to form said body of silicon dioxide.

13. The method of claim 11 including forming by epitaxial growth a layer of silicon overlying the major surface of each of said islands of silicon, treating said epitaxial layer of silicon to form a planar surface thereon.

14. The method of claim 11 including epitaxially growing a plurality of layers of silicon, each on the major surface of a respective one of said islands.

15. The method of claim 14 including treating said epitaxial layers of silicon to form a planar surface on each of said epitaxial layers of silicon.

16. The method of claim 11 including depositing a continuous layer of polycrystalline silicon on the exposed major surface of each of said islands and the exposed portion of said body of silicon dioxide on said substrate, converting said layer of polycrystalline silicon into a layer of monocrystalline silicon by annealing.

17. The method of claim 14 including depositing a continuous layer of polycrystalline silicon on the exposed portions of said epitaxial layers of silicon and the exposed portion of said body of silicon dioxide on said substrate, converting said layer of polycrystalline silicon into a layer of monocrystalline silicon by annealing.

18. The method of claim 16 including treating said layer of monocrystalline silicon to form a planar surface thereon.

19. The method of claim 17 including treating said layer of monocrystalline silicon to form a planar surface thereof.

* * * * *